US012650814B2

(12) United States Patent
Shu et al.

(10) Patent No.: US 12,650,814 B2
(45) Date of Patent: Jun. 9, 2026

(54) RAM TRUE RANDOM NUMBER GENERATOR

(71) Applicant: GSI Technology Inc., Sunnyvale, CA (US)

(72) Inventors: Lee-Lean Shu, Los Altos, CA (US); Dan Ilan, Herzliya (IL); Tomer Sery, Kochav Yair (IL); Avidan Akerib, Tel Aviv (IL)

(73) Assignee: GSI Technology Inc., Sunnyvale, CA (US)

( * ) Notice: Subject to any disclaimer, the term of this patent is extended or adjusted under 35 U.S.C. 154(b) by 1047 days.

(21) Appl. No.: 17/700,122

(22) Filed: Mar. 21, 2022

(65) Prior Publication Data

US 2022/0300255 A1 Sep. 22, 2022

Related U.S. Application Data

(60) Provisional application No. 63/163,892, filed on Mar. 21, 2021.

(51) Int. Cl.

| | |
|---|---|
| ***G06F 7/58*** | (2006.01) |
| ***G11C 11/408*** | (2006.01) |
| ***G11C 11/4091*** | (2006.01) |
| ***G11C 11/419*** | (2006.01) |

(52) U.S. Cl.

CPC .......... *G06F 7/588* (2013.01); *G11C 11/4085* (2013.01); *G11C 11/4091* (2013.01); *G11C 11/419* (2013.01)

(58) Field of Classification Search

CPC ........... G06F 7/58–588; G11C 11/4085; G11C 11/4091

See application file for complete search history.

(56) References Cited

U.S. PATENT DOCUMENTS

| | | | | |
|---|---|---|---|---|
| 4,694,205 | A | 9/1987 | Shu | |
| 5,355,343 | A | 10/1994 | Shu | |
| 8,593,860 | B2 | 11/2013 | Shu | |
| 10,838,726 | B1 | 11/2020 | Peng | |
| 11,049,555 | B1 * | 6/2021 | Tsai | G11C 8/08 |
| 2010/0191903 | A1 | 7/2010 | Rao | |
| 2014/0334238 | A1 | 11/2014 | Ware | |
| 2015/0381113 | A1 | 12/2015 | Price | |
| 2016/0329092 | A1 | 11/2016 | Akerib | |
| 2018/0039484 | A1 * | 2/2018 | La Fratta | G11C 11/4087 |
| 2018/0286486 | A1 * | 10/2018 | Tiwari | G11C 16/22 |
| 2021/0028935 | A1 * | 1/2021 | Wu | H04L 9/0869 |
| 2022/0051711 | A1 * | 2/2022 | Ayyapureddi | G06F 7/58 |

OTHER PUBLICATIONS

International Search Report for corresponding application PCT/IB2022/052572 mailed on Jun. 27, 2022.

* cited by examiner

*Primary Examiner* — Carlo Waje

(74) *Attorney, Agent, or Firm* — Heidi Brun Associates Ltd.; Heidi M. Brun

(57) ABSTRACT

A system to generate true random numbers includes a RAM array, a null-read controller and a hash generator. The RAM array has memory cells and a sense amplifier. The memory cells store data therein, the cells are connected in rows to word lines and in columns to pairs of bit lines, and the sense amplifier senses a differential input signal. The null-read controller implements a null-read operation by the sense amplifier of a portion of the RAM array. The hash generator receives a null-read result from the null-read operation and outputs a partial true random number based on the null-read result.

31 Claims, 8 Drawing Sheets

RAM TRUE RANDOM NUMBER GENERATOR

CROSS REFERENCE TO RELATED APPLICATIONS

This application claims priority from U.S. provisional patent application 63/163,892, filed Mar. 21, 2021, which is incorporated herein by reference.

FIELD OF THE INVENTION

The present invention relates to random number generators generally and to true random number hardware generators in particular.

BACKGROUND OF THE INVENTION

Random numbers are needed for many applications such as gambling, statistical sampling, computer simulation, and cryptography. Random number generation is a process by which a sequence of numbers, or any other symbols, that cannot be reasonably predicted is generated. A sequence that is produced by a random number generator (RNG) will contain some patterns that are discernable in hindsight, but are not predictable in foresight. A pseudorandom number generator (PRNG) generates numbers that appear random, but are in fact pre-determined, and may be reproduced by knowing the 'seed' value input to the PRNG, and the state of the PRNG. Most software implemented random number generators are PRNGs.

In contrast, the number sequence from a true random number generator (TRNG) is a function of a physical environment that is changing in a manner that cannot be modeled, such as measuring atmospheric noise, thermal noise, and radioactive decay of a material. Critical applications that require randomness, such as in security, generally use hardware random number generation.

SUMMARY OF THE PRESENT INVENTION

There is therefore provided, in accordance with a preferred embodiment of the present invention, a true random number generator system. The system includes a RAM array, a null-read controller and a hash generator. The RAM array has memory cells and a sense amplifier. The memory cells store data therein, the cells are connected in rows to word lines and in columns to pairs of bit lines, and the sense amplifier senses a differential input signal. The null-read controller implements a null-read operation by the sense amplifier of a portion of the RAM array. The hash generator receives a null-read result from the null-read operation and outputs a partial true random number based on the null read result.

Moreover, in accordance with a preferred embodiment of the present invention, the differential input signal is on pairs of bit lines when they are connected to the sense amplifier, or a pair of local data lines when they are connected to the sense amplifier.

Further, in accordance with a preferred embodiment of the present invention, the null-read controller includes a differential voltage conditioner (DVC) and a word line overrider (WLO). The DVC minimizes the sense amplifier offset voltage in the sense amplifier during the a null-read operation. The WLO stops a row controller activating connected word lines during a null read of the differential input signal on one of the pairs of bit lines, the connected word lines being connected to the rows of memory cells.

Still further, in accordance with a preferred embodiment of the present invention, the WLO outputs a word line address disable (WLAD) signal to disable all word line activations by the row decoder.

Additionally, in accordance with a preferred embodiment of the present invention, the WLO outputs an unconnected word line selection (UWLS) signal to enable the row controller to activate only unconnected word lines. The unconnected word lines are not connected to the rows of the memory cells.

Moreover, in accordance with a preferred embodiment of the present invention, prior to the null read operation, the DVC conditions the pair of bit lines by equalizing the number of stored 0s and 1s per the pair of bit lines, performing an additional RAM No-OP cycle, performing a valid-read operation, or performing a valid-write of 0 followed by a valid-read operation.

Alternatively, in accordance with a preferred embodiment of the present invention, the null-read controller includes a differential voltage conditioner (DVC) and a column controller. The DVC minimizes the sense amplifier offset voltage in the sense amplifier during a null-read operation. The column controller stops the column pass gates connecting the pair of bit lines to the pair of local data lines during a null read of the differential input signal on the pairs of local data lines.

Moreover, in accordance with a preferred embodiment of the present invention, prior to the null read operation, the DVC conditions the pair of local data lines by equalizing the number of stored 0s and 1s connected to the pair of local data lines, performing a additional RAM No-OP cycle, performing a valid-read operation, or performing a valid-write of 0 followed by a valid-read operation.

Further, in accordance with a preferred embodiment of the present invention, the RAM array is an SRAM (static random access memory) array.

Still further, in accordance with a preferred embodiment of the present invention, the RAM array is a DRAM (dynamic random access memory) array.

Additionally, in accordance with a preferred embodiment of the present invention, the null-read operation is a single null read, a multiplicity of sequential null reads, or a multiplicity of simultaneous null reads.

Moreover, in accordance with a preferred embodiment of the present invention, the RAM array stores the null-read result.

Alternatively, in accordance with a preferred embodiment of the present invention, the null read controller concatenates two null-read results to form a concatenated null-read result.

Further, in accordance with a preferred embodiment of the present invention, the RAM array stores a partial true random number.

Still further, in accordance with a preferred embodiment of the present invention, the hash generator concatenates two partial true random numbers to form a true random number.

Additionally, in accordance with a preferred embodiment of the present invention, the memory cells are 6T SRAM, 8T SRAM, dual-port SRAM or multi-port SRAM.

Additionally, in accordance with a preferred embodiment of the present invention, a multiplicity of the RAM arrays are arranged into a RAM bank.

There is provided in accordance, with a preferred embodiment of the present invention, a method for a RAM (random access memory) array. The method includes executing a null-read operation.

Moreover, in accordance with a preferred embodiment of the present invention, executing a null-read operation includes pre-charging a pair of differential lines in the RAM array to a predetermined voltage, and differentially reading a differential signal on the pair of differential lines by a sense amplifier, without receiving a second differential signal from a memory cell onto the pair of differential lines after the pre-charging.

Additionally, in accordance with a preferred embodiment of the present invention, the pair of differential lines is a pair of bit lines when they are attached to the sense amplifier, or a pair of local data lines when they are attached to the sense amplifier.

Moreover, in accordance with a preferred embodiment of the present invention, conditioning the pair of differential lines prior to the pre-charging is by equalizing the number of stored 0s and 1s per the pair of differential lines, performing an additional RAM No-OP cycle, second performing a valid-read operation, or third performing a valid-write of 0 followed by a valid-read operation.

Still further, in accordance with a preferred embodiment of the present invention, the differentially reading includes enabling a word line address disable (WLAD) signal to disable all word line activations by a row decoder, or enabling an unconnected word line selection (UWLS) signal such that the row controller activates only unconnected word lines which are the word lines that are not connected to rows of the memory cells.

Alternatively, in accordance with a preferred embodiment of the present invention, the differentially reading includes stopping column pass gates connecting the pairs of bit lines to the pair of local data lines, the pairs of bit lines also being connected to the columns of the memory cells.

There is therefore provided, in accordance with a preferred embodiment of the present invention, a method to generate a true random number. The method includes pre-charging a pair of differential lines in a portion of a RAM array to a predetermined voltage, null-reading a differential signal on the pair of differential lines, receiving a null-read result from the null-reading, and generating a partial true random number based on the a null-read result.

Moreover, in accordance with a preferred embodiment of the present invention, the pair of differential lines is a pair of bit lines when they are attached to a sense amplifier, or a pair of local data lines when they are attached to the sense amplifier.

Further, in accordance with a preferred embodiment of the present invention, the null-reading includes differentially reading the differential signal on the a pair of differential lines by a the sense amplifier, without receiving a second differential signal from a memory cell onto the pair of differential lines after the pre-charging.

Still further, in accordance with a preferred embodiment of the present invention, the differentially reading includes enabling a word line address disable (WLAD) signal to disable all word line activations by a row decoder, or enabling an unconnected word line selection (UWLS) signal such that the row controller activates only unconnected word lines which are the word lines that are not connected to rows of the memory cells.

Alternatively, in accordance with a preferred embodiment of the present invention, the differentially reading includes stopping column pass gates connecting the pairs of bit lines to the pair of local data lines, the pairs of bit lines also being connected to the columns of the memory cells.

Additionally, in accordance with a preferred embodiment of the present invention, the null-reading is a single null read, a multiplicity of sequential null reads, or a multiplicity of simultaneous null reads.

Moreover, in accordance with a preferred embodiment of the present invention, the method includes first storing the a null-read result in a RAM array.

Further, in accordance with a preferred embodiment of the present invention, the method includes first concatenating two null-read results to form a concatenated null-read result.

Still further, in accordance with a preferred embodiment of the present invention, the method includes second storing the partial true random number in the a RAM array.

Moreover, in accordance with a preferred embodiment of the present invention, the method includes second concatenating at least two the partial true random numbers to form a true random number.

Additionally, in accordance with a preferred embodiment of the present invention, the method includes conditioning the pair of differential lines prior to the pre-charging by equalizing the number of stored 0s and 1s per differential line pair, performing an additional RAM No-OP cycle, second performing a valid-read operation, or third performing a valid-write of 0 followed by a valid-read operation.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
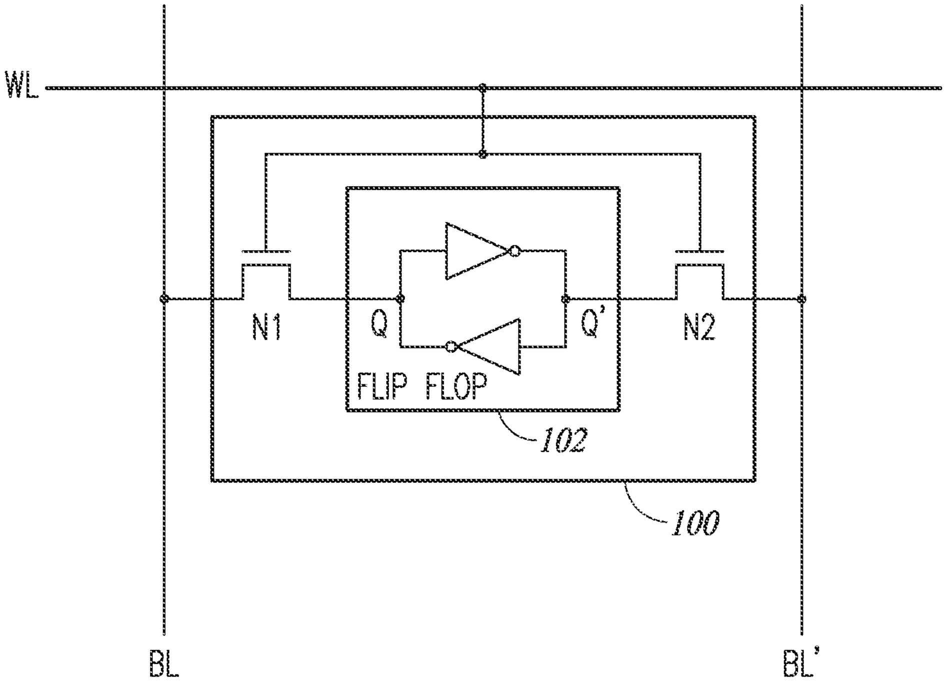
FIG. 1 is a schematic illustration of a standard 6T SRAM (static random access memory) memory cell.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Applicant has realized that elements in a standard 6T SRAM (static random access memory) array, may be used in a true random number generator (TRNG) system. In order to understand the operation of the TRNG system, the structure and operation of SRAM arrays will be presented.

SRAM Background

Figure 2:
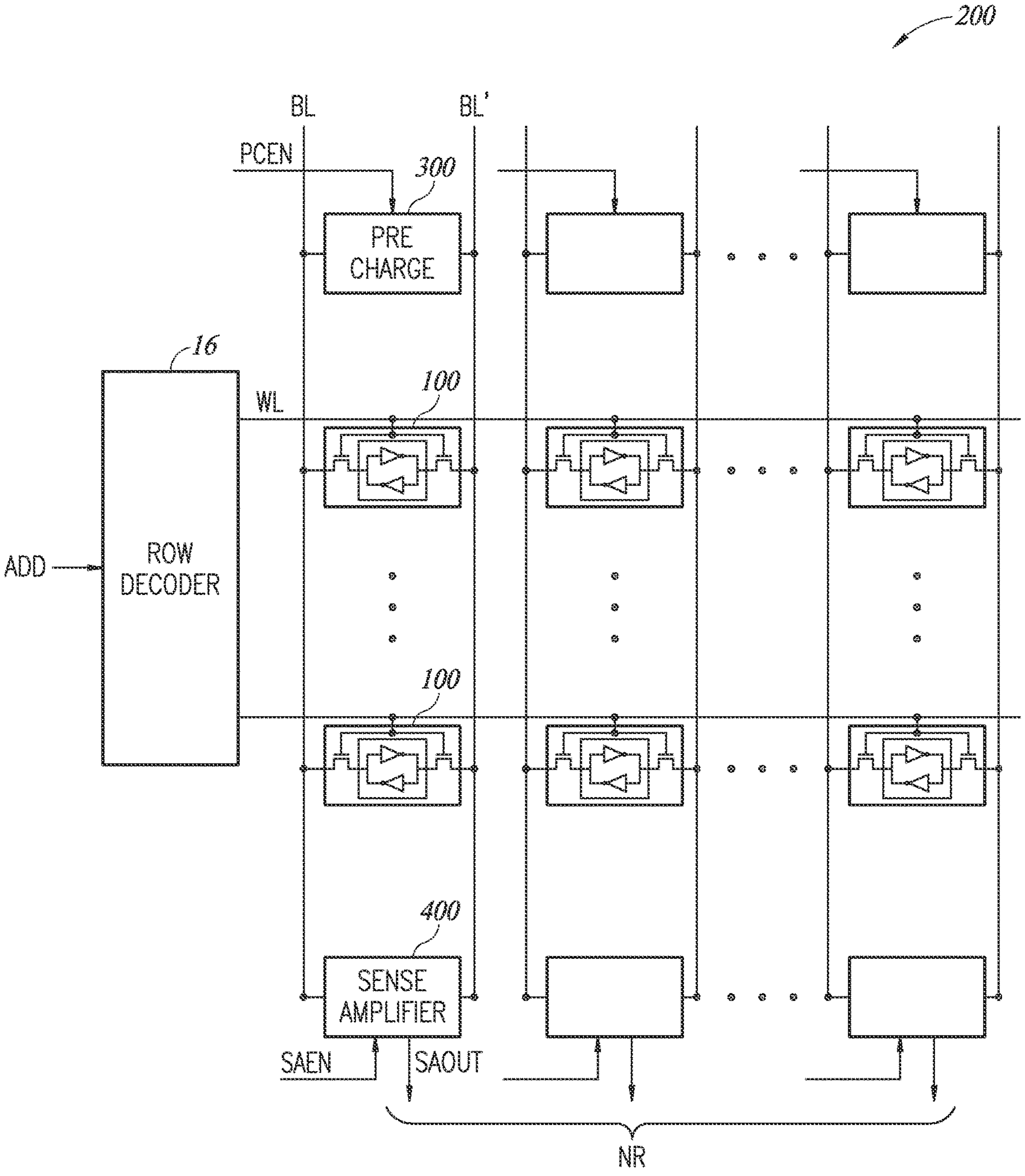
FIG. 2 is a schematic illustration of a SRAM memory array.

Reference is now made to FIG. 1, which illustrates a standard 6T SRAM memory cell 100 composed of six transistors, and to FIG. 2 which illustrates an SRAM memory array 200 of multiple cells 100.

Four transistors (not shown) of 6T SRAM cell 100 form a standard flip-flop element 102 that has two stable voltage states which define as the logical "0" and "1" states of cell 100. Typically, a high voltage value defines the logical "1" and a low voltage value defines the logical "0". The cell outputs its stored value via node Q and its complementary value via node Q'. Thus if cell 100 stores the value "1", the voltage value at node Q reflects the value of "1" and the voltage value at complementary node Q' reflects the value of "0".

Two bit lines, BL and BL', are used to transfer data from the cell for read operations. The bit lines BL and BL' are connected to flip-flop 102 via two pass transistors N1 and N2 respectively, which control access to the cell.

As shown in FIG. 2, the cells in memory array 200 are arranged in a matrix. All the cells 100 in the same column are connected to the same bit line pair BL and BL' via the access transistors N1 and N2 of each cell. All the cells in the same row are connected to the same word line WL. The column of cells is selected by charging bit lines BL and BL' of the desired column with the appropriate voltage. Row decoder 16 controls the row selection by charging word line WL of the selected row to high.

When row decoder 16 selects a word line WL, according to ADD, the input row address, as the gates of transistors N1 and N2 are connected to word line WL then gate transistors N1 and N2 of all cells 100 in the selected row are activated. Then the contents of cells 100 may be accessed for read operations. Hence the selected cell 100 is the cell that resides at the intersection of word line WL and the bit line pair BL and BL' for a column.

SRAM Read Operation

Figure 3:
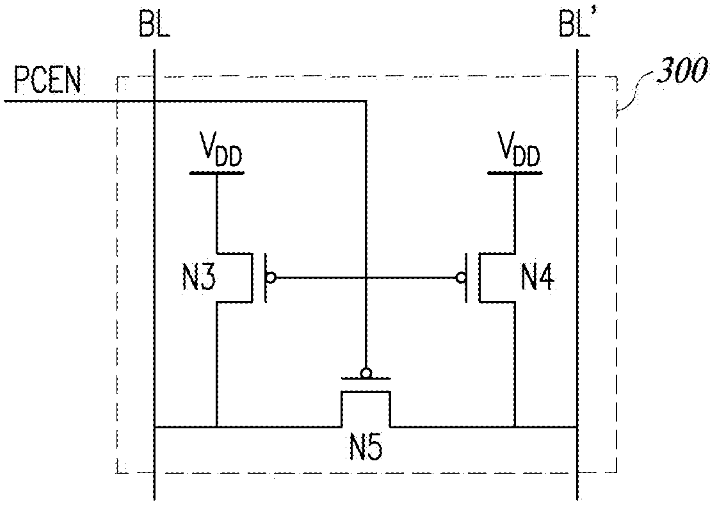
FIG. 3 is a schematic illustration of a pre-charge circuit.

To read the state of 6T SRAM cell 100, first, both bit lines BL and BL' are pre-charged to a high voltage level by a pre-charge circuit 300, which is connected to bit lines BL and BL'. Reference is now made to FIG. 3, which illustrates an exemplary implementation of a standard pre-charge circuit 300. Pre-charge circuit 300 comprises three transistors N3 thru N5. Transistor N3 is a gating transistor that controls the connection of voltage source $V_{DD}$ to bit line BL. Transistor N4 is a gating transistor that controls the connection of voltage source $V_{DD}$ to bit line BL'. Transistor N5 is a gating transistor that controls the connection of bit line BL to bit line BL'. The gates of all transistors N3 thru N5 are controlled by a pre-charge enable signal, PCEN.

To pre-charge bit lines BL and BL', signal PCEN may be enabled, which turns on all transistors N3 thru N5. Bit lines BL and BL' may both be charged toward $V_{DD}$. After a predetermined time, Tpc, then the voltage levels on bit lines BL and BL' may stabilize, signal PCEN may be disabled, leaving bit lines BL and BL' floating high with a balanced voltage.

Then row decoder 16 activates word line WL which activates pass transistors N1 and N2 in cell 100, connecting nodes Q and Q' to bit lines BL and BL' respectively. When connected, voltage levels of nodes Q and Q' will affect the final voltage on bit lines BL and BL', respectively. One of nodes Q and Q' stores logical value "1", or a voltage level at $V_{DD}$, and the other of nodes Q and Q' stores logical value "0", or a voltage level at $V_{SS}$. For example, as transistor N1 and transistor N2 are on, then if cell 100 stores a "1", and node Q equals 1 and node Q' equals 0, then the voltage level on bit line BL stays at voltage $V_{DD}$ and the voltage level on bit line BL' starts to be pulled low by flip flop 102 through transistor N2. If cell 100 stores a "0", then the voltage level on bit line BL' stays at voltage level $V_{DD}$ and the voltage level on bit line BL starts to be pulled low. As explained hereinbelow, sense amplifier (SA) 400 measures the final voltage levels on bit lines BL and BL' according to the content of cell 100.

Figure 4:
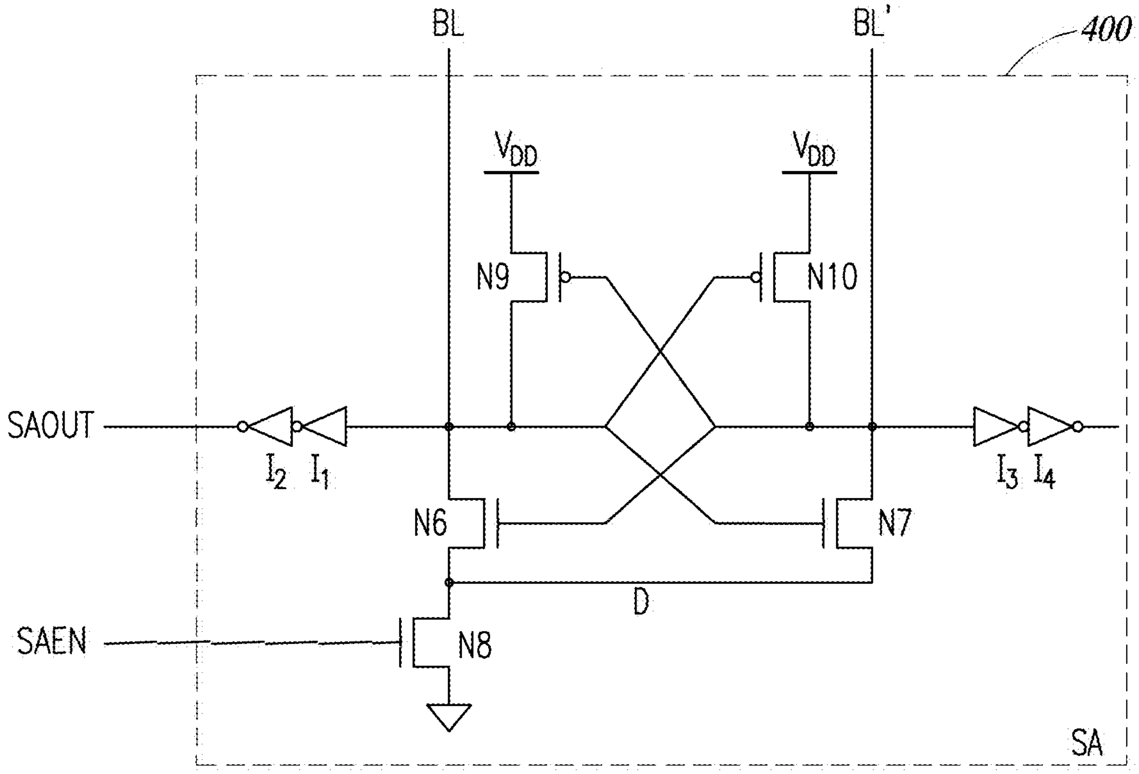
FIG. 4 is a schematic illustration of a sense amplifier circuit.

After a predetermined time, $T_{read}$, the signal or the delta voltages on bit lines BL and BL' develops, then SA 400 may compare the voltage levels on bit lines BL and BL'. Reference is now made to FIG. 4, which illustrates an exemplary implementation of a standard SA circuit 400. SA circuit 400 has four inverters I1 thru I4, and five transistors: a cross connected pair N6 and N7; a cross connected pair N9 and N10; and, a gating transistor N8. Bit line BL is connected to the drain of transistor N6, the drain of transistor N9, the gate of transistor N10, the gate of transistor N7 and the input of inverter I1. The output of inverter I1 is connected to the input of inverter I2, and the output of inverter I2 is the output of SA 400, "SAOUT". Bit line BL' is connected to the drain of transistor N7, the drain of transistor N10, the gate of transistor N9, the gate of transistor N6 and the input of inverter I3. The inverters I3 and I4 form a dummy device to provide a balanced capacitance to bit line BL' to mimic the capacitance load of inverters I1 and I2 to bit line BL. The source of transistors N6 and N7 are connected to node D. Transistor N9 is connected between voltage source $V_{DD}$ and bit line BL. Transistor N10 is connected between voltage source $V_{DD}$ and bit line BL'. Transistor N8 is connected between the sources of transistors N6 and N7 and ground. The gate of transistor N8 is connected to sense amplifier enable signal (SAEN) which acts as an enable and disable for the entire sense amplifier.

Transistor N8 is activated by signal SAEN, causing SA 400 to output a cell read value, equal to either a logical "1" or to a logical "0". When SAEN is enabled, transistor N8 is turned on and pulls node D low. If the voltage level on bit line BL is higher than the voltage level on bit line BL', then transistor N7 has more drive strength than transistor N6. Then bit line BL' is pulled low and bit line BL is pulled back up high by transistor N9 after an initial dip. Inverters I1 and I2 will then buffer the signal on bit line BL to a logic 1 as the output, SAOUT, of SA. Accordingly, SA 400 outputs a logical "1" indicating that cell 100 is storing the value "1." The converse is true for a stored value of "0".

The memory cell transistors in circuit 100 consist of minimum size transistors for small memory cell size. The transistor drive capability to pull down bit lines BL and BL' during a read operation is weak. Bit lines BL and BL' are high capacitance lines, with many connected cells 100. Therefore, bit line BL and BL' need time to discharge, and to develop the signal margin to overcome the inherent SA offset voltage.

The SA offset voltage comprises the sum of the following:

1. The mismatch of VT (Threshold Voltage) and GM (Transconductance) of NMOS cross coupled transistor pair, N6 and N7 in the SA 400 circuit.

2. The mismatch of VT (Threshold Voltage) and GM (Transconductance) of PMOS cross coupled transistor pair, N9 and N10 in the SA 400 circuit.
3. The capacitance mismatch of bit lines BL and BL'.
4. The leakage current mismatch of bit lines BL and BL'.

Null-Read Operation

Applicant has realized that a sense amplifier may compare a differential voltage signal between bit lines BL and BL' even when no cell has been read, during what may be defined as a "Null Read" operation.

As mentioned herein above, after pre-charging, the voltages on bit line BL and bit line BL' may be equalized and stay at voltage level $V_{DD}$. When word line WL is activated, either bit line BL or BL' may be pulled low, as explained hereinabove. In the null read case, where no word line WL is activated, SA 400 may still perform sensing when SAEN is on and SAOUT flips to either 1 or 0 based on SA offset voltages discussed hereinabove.

Spatial Randomness

SA offset voltage is randomly distributed across the chip. The neighboring SA may have varied offset voltages, with some SA having an offset voltage favoring bit line BL, while another SA have an offset voltage favoring BL'. Therefore, the null read value on SAOUT may vary from location to location across the chip, and also vary from chip to chip in a giving location.

Temporal Randomness

Applicant has also realized that a number of sense amplifiers in a chip may have SA offset voltages so small that the null read value on SAOUT may vary between different null read cycles influenced by changing physical effects, such as electrical noises, temperature effects, etc. Since these effects change with time, the random SAOUT may be defined as "temporally random."

True Random Number Generator System

Applicant has realized that, since SRAMs are ubiquitously embedded in the designs of processor, GPU, FPGA and microcontrollers, an SRAM memory array used for embedded memory storage under normal operation may also be used as the basis for a true random number generator system. Applicant has also realized that an output from an SRAM null-read may be used as an input to a hash encoder to output a true random number.

Applicant has realized that by keeping the output of the SRAM null read to the hash generator entirely within the domain of the claimed system, it cannot be altered by external entities, thus guaranteeing the integrity of the process.

Figure 5A:
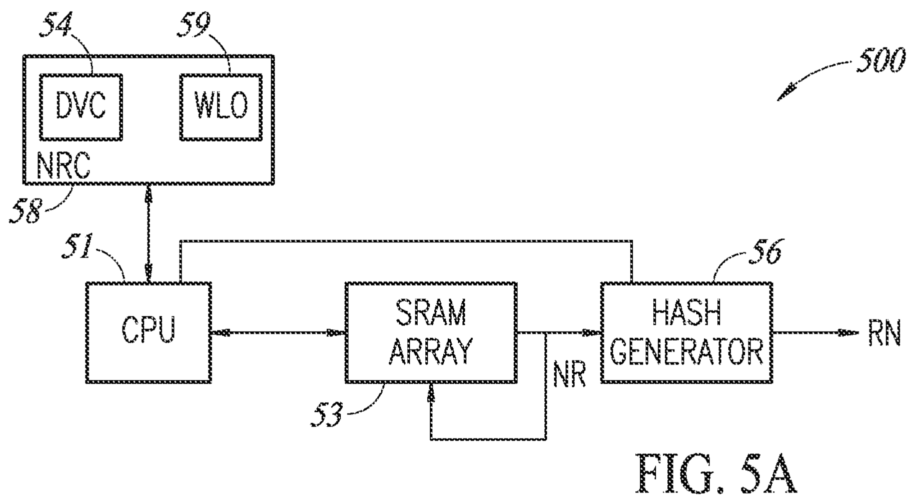
FIGS. 5A and 5B are schematic illustrations of a STRNG (SRAM true random number generator) system.

Reference is made to FIG. 5A which is an illustration of an SRAM true random number generator (STRNG) 500. STRNG 500 comprises a CPU 51, an SRAM array 53 (similar to SRAM array 200 in FIG. 2), a hash generator 56, and a null-read controller (NRC) 58. NRC 58 comprises a differential voltage conditioner (DVC) 54, and word line overrider (WLO) 59.

CPU 51 may control the operation of row decoder 16, pre-charge circuit 300 and SA 400 (as shown in FIG. 2) within SRAM array 53. NRC 58 may supply techniques to CPU 51 to perform single or multiple null-read operations. WLO 59 may apply additional word line conditioning, as explained hereinbelow, such that SA 400 may make differential bit line measurements without cell 100 reads, during null-read operations. DVC 54 may apply conditioning techniques, as explained hereinbelow, such that bit lines BL and BL' may become more precisely balanced during null-read operations.

SRAM array 53 may output a null-read result NR to hash generator 56, or may store result NR in SRAM array 53. Hash generator 56 may hash result NR to produce a random number, RN, such that RN=H(NR), where H is the hash function of hash generator 56.

Figure 5B:
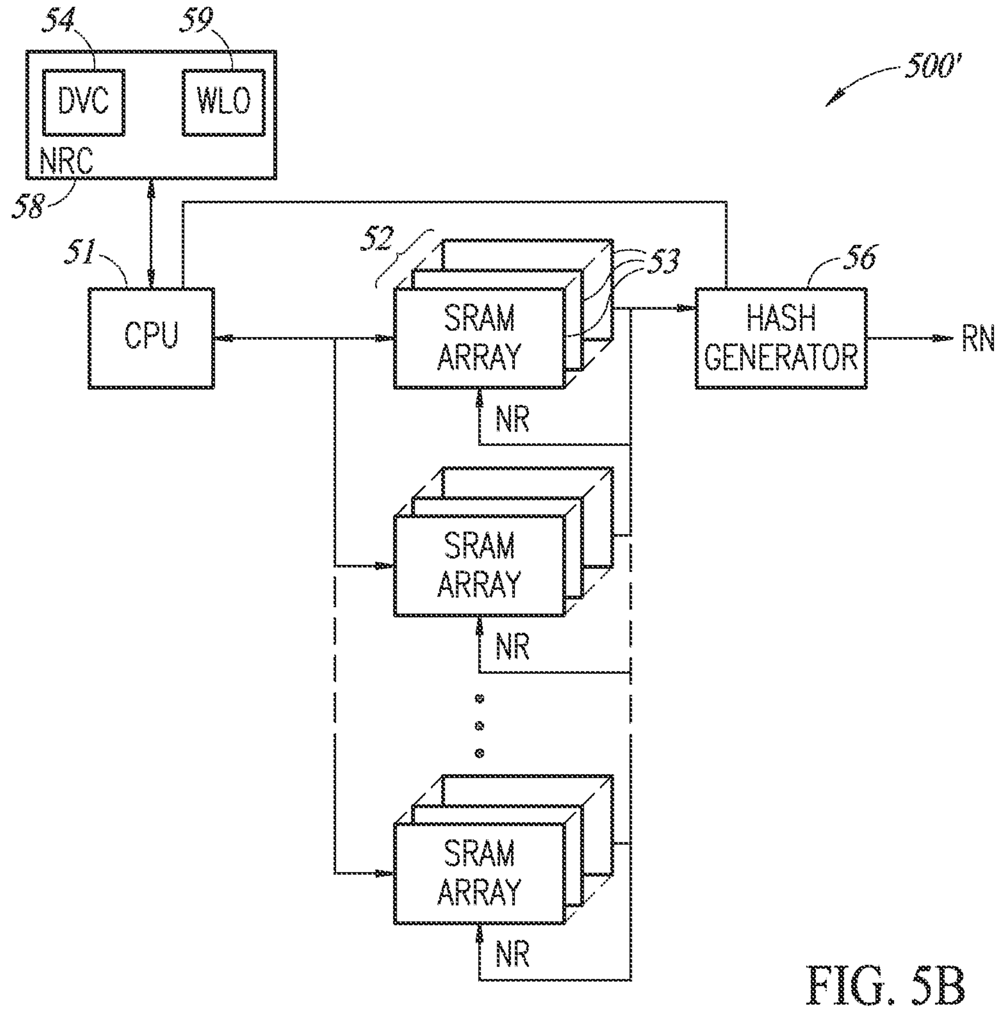

In an alternate embodiment, SRAM true random number generator may comprise a multiplicity of SRAM arrays organized into SRAM banks. Reference is briefly made to FIG. 5B which illustrates an alternative STRNG, labeled 500'. STRNG 500' is similar to STRNG 500 in that it comprises CPU 51, hash generator 56, and differential voltage conditioner (DVC) 54. However, in this embodiment, STRNG 500' comprises a multiplicity of SRAM banks 52 each comprising a plurality of SRAM arrays 53. CPU 51 may be connected to each SRAM array 53, and to each SRAM bank 52, to NRC 58 and to hash generator 56.

As in STRNG 500, CPU 51 may control the operation of all row decoders 16, all pre-charge circuits 300 and all SAs 400 within any of the multiplicity of SRAM arrays 53. STRNG 500' may perform a null-read operation on a multiplicity of SAs 400 that may be contiguous on a single SRAM array 53, non-contiguous on a single SRAM array 53, non-contiguous across a multiplicity of SRAM arrays 53 in a single SRAM bank 52, or non-contiguous across a multiplicity of SRAM arrays 53 across a multiplicity of SRAM banks 52. Likewise, output NR may be stored in a contiguous or non-contiguous fashion.

Figure 6A:
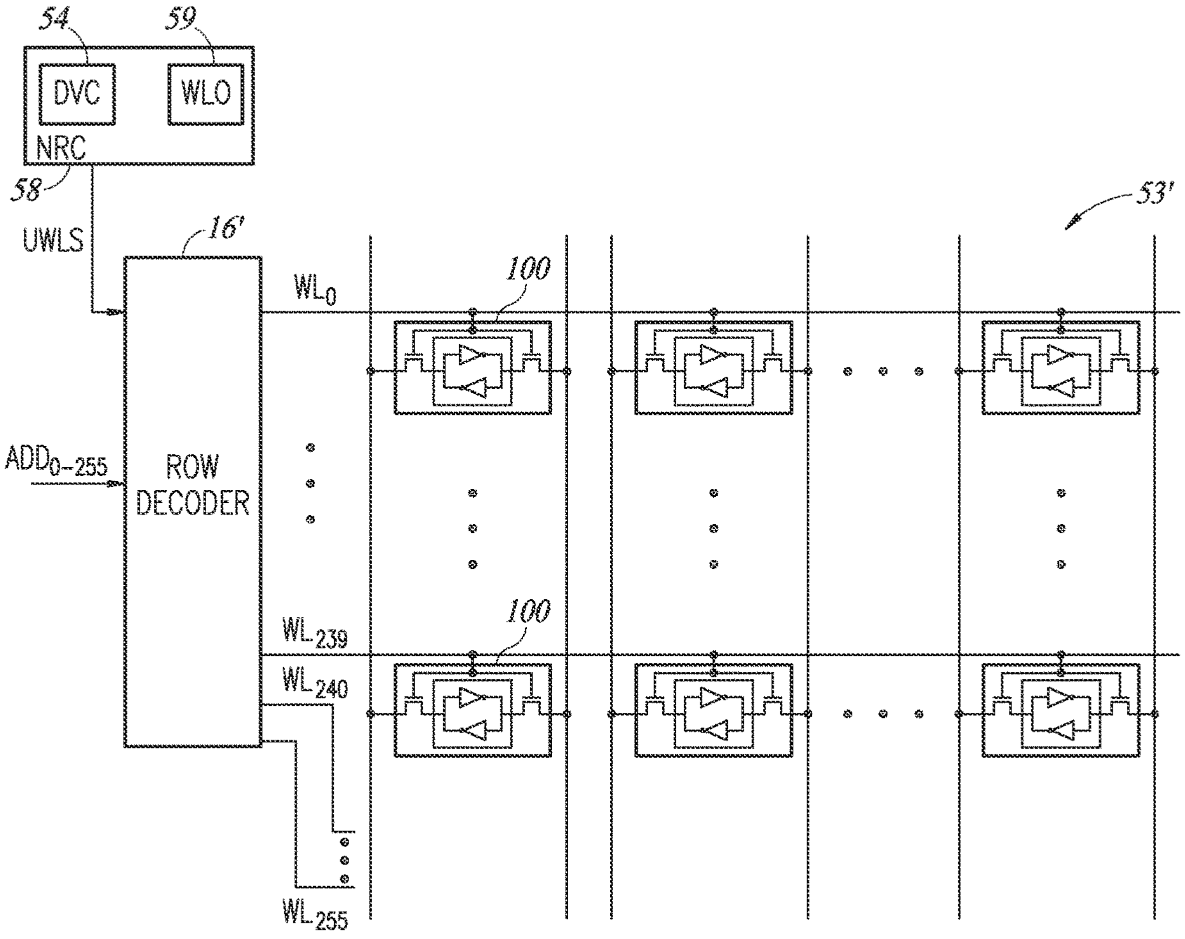
FIGS. 6A and 6B are schematic illustrations of row decoder implementations in SRAM arrays.

Applicant has realized that STRNG 500 or 500' may perform a null-read operation using a standard row decoder that accesses a word line not connected to a row of cells 100, in any SRAM array 53. Reference is made to FIG. 6A which illustrates NRC 58 connected to a row decoder 16' and memory cells 100 of an SRAM array 53' (similar to that shown in FIG. 2). As explained hereinabove, row decoder 16' of SRAM array 53' may access one of its word lines $WL_0$ thru $WL_{255}$.

Applicant has realized that, by having more word lines WL than the number of rows of memory cells 100 in memory array 53', then there may be a plurality of word lines WL that are not connected to any row of cells 100, in any memory array 53'. For example, if row decoder 16' receives address ADD, which may be an 8 bit address (with 256 possible addresses), ADD[0:7], then row controller 16' may control 256 word lines $WL_0$ thru $WL_{255}$. If the number of rows in memory array 53 actually connected to memory cells 100 is less than 256, say 240, then row decoder 16' may use word line addresses ADD[0:7] from 0 to 239 to activate word lines $WL_0$ to $WL_{239}$ which are connected to memory cells 100, and may use word line addresses ADD[0:7] from 240 to 255 to activate unconnected word lines $WL_{240}$ to $WL_{255}$. Hence, WLO 59, (via NRC 58 and via CPU 51) may output an unconnected word line selection signal, UWLS, to row decoder 16', such that row decoder 16' may select a word line address between ADD[0:7] from 240 to 255, which may activate an unconnected word line $WL_{240}$ to $WL_{255}$, in order that selected SAs 400 may perform a null-read.

Figure 6B:
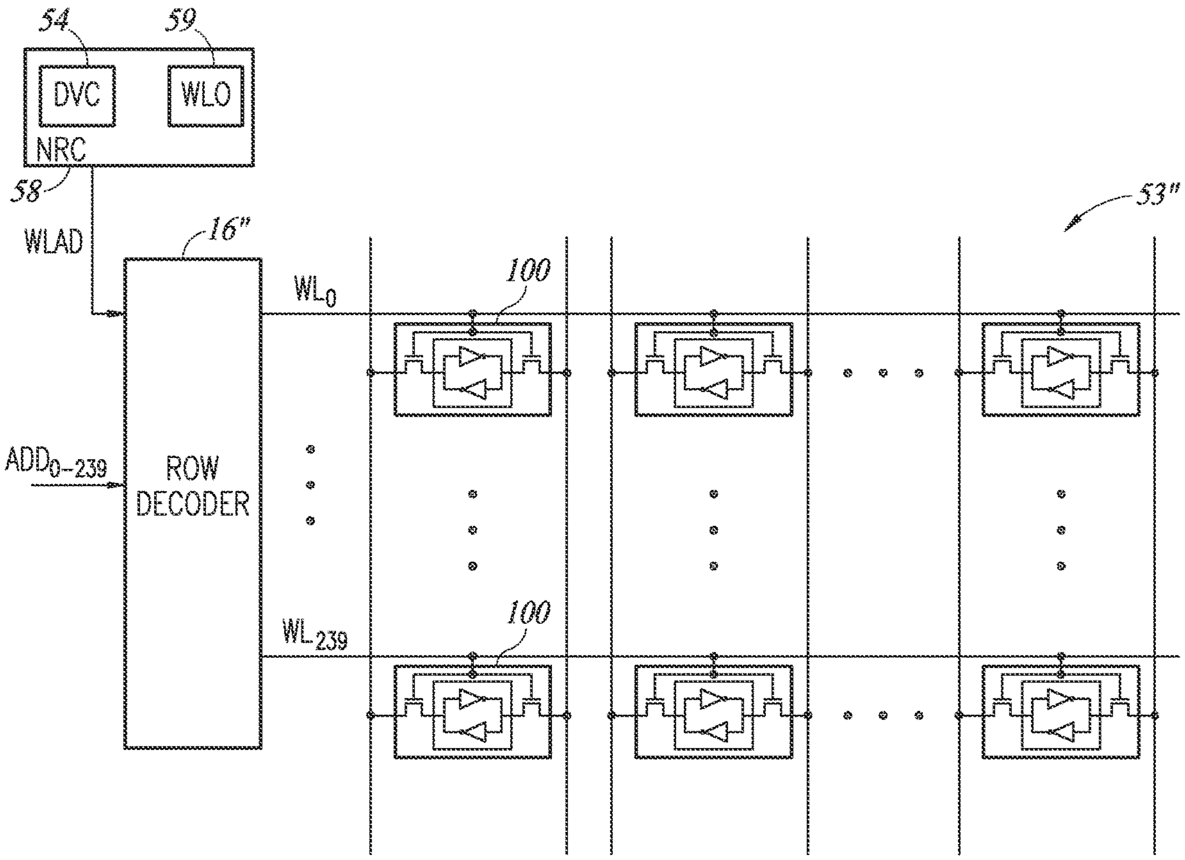

Reference is briefly made to FIG. 6B which illustrates an alternate embodiment of SRAM array 53", that comprises a row decoder 16" which receives a word line address disable signal WLAD from WLO 59, (via NRC 58 and via CPU 51). When activated, signal WLAD may disable all word line outputs $WL_0$ thru $WL_{239}$ from row decoder 16". Hence, when signal WLAD is enabled, selected SAs 400 may perform null-reads regardless of the value of word line address ADD.

Figure 7A:
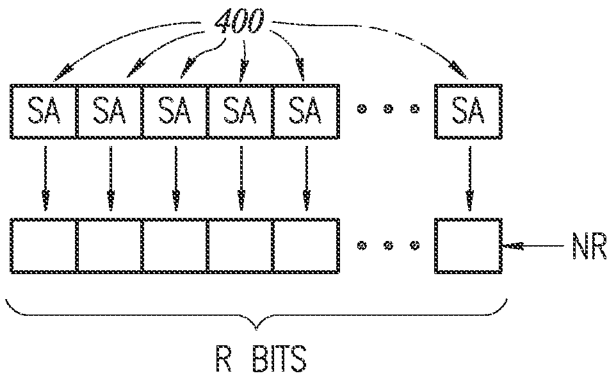
FIGS. 7A thru 7D are schematic illustrations inputs and outputs of sense amplifiers and hash generators.

Reference is made to FIGS. 7A thru 7D which illustrate inputs and outputs of SAs 400 and hash generator 56 (similar to those shown in FIG. 6A). As shown in FIG. 7A, SRAM array 53 may perform a null-read utilizing a plurality R of SAs 400 at one time. After a null-read operation, SAs 400 may output the R bits of null-read result NR to hash generator 56.

Figure 7B:
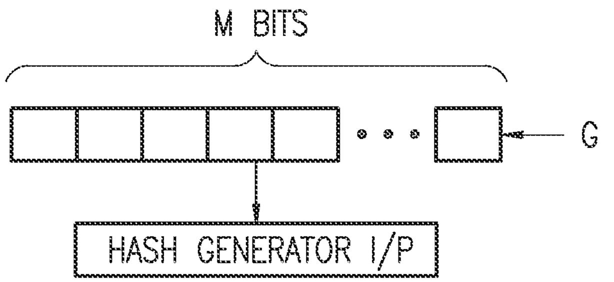

Hash generator 56 may require an input G of M bits, as shown in FIG. 7B.

Figure 7C:
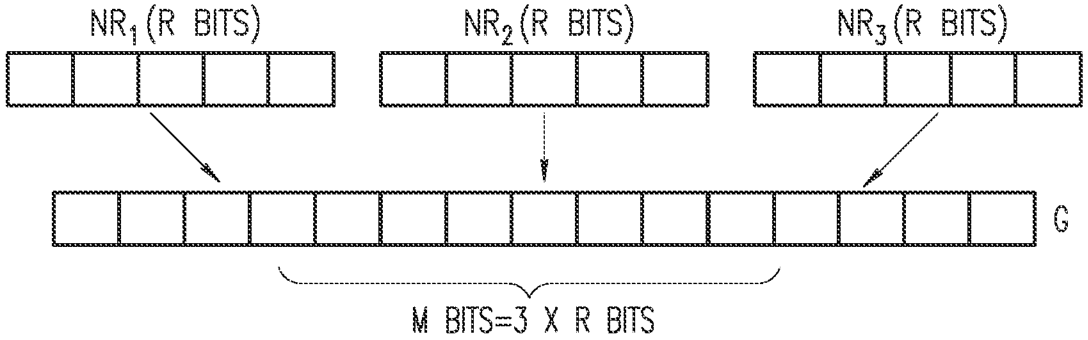

As shown in FIG. 7C, if M is greater than R, then SRAM array 53 may make a plurality of null-reads, for example: $NR_1$, $NR_2$ and $NR_3$, and then may form a concatenated M bit output G, suitable for input to hash generator 56.

It will be appreciated that STRNG 500', rather than making multiple null-reads, a single set of SAs 400 may make a plurality of simultaneous null-reads on a plurality of SAs 400 in different areas of SRAM array 53 and/or across multiple SRAM arrays 53 in either the same or different SRAM banks 52.

Figure 7D:
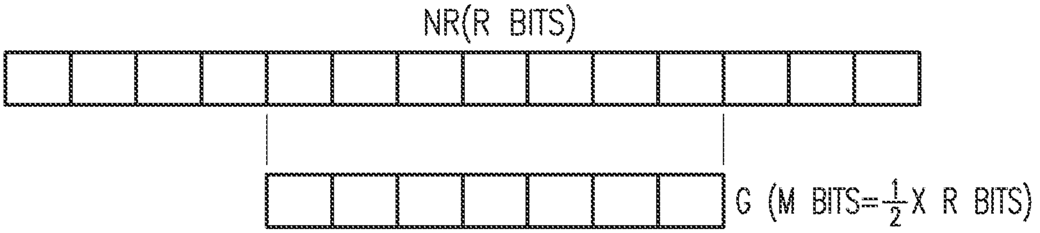

A shown in FIG. 7D, if hash generator 56 requires an input G of M bits, and if M is less than R, then array 53 may output a subset of the R bits of result NR to hash generator 56.

It should be noted that cryptographic hash functions, such as SHA-K, may take a variable length input of M bits and produce a fixed length output of K bits. For example, the input sequence M may be 32768 bits, and the output sequence K may be 256 bits, as for example in SHA-256.

Applicant has realized that if the number M of bits required as input G by hash generator 56 includes at least K random bits, then H(M) is a true random number of K bits.

Applicant has realized that, at any given time, about 5% of sense amplifiers may produce temporally random data. Therefore, as long as 5% of M is greater than K, then the hash of G, H(G), may be a true random number of K bits.

It should also be noted that if the required true random number (TRNG-N) has N bits, and the number of bits output from hash generator 53 is K bits, then if K is greater than N, hash generator 56 may output an N bit subset of the K bit hash generator output. However, if K is less than N, then system 500 may invoke several null-read and hash generations, which may then be concatenated to form a TRN of a full N bits.

Bit Line Differential Voltage Conditioning

During a normal read operation the pre-charge time, Tpc, may not be long enough to fully equalize bit lines BL and BL' to voltage level $V_{DD}$. This may be an acceptable design choice as it takes less time to develop the sense signal on bit lines BL and BL' than to fully equalize the voltage levels on bit lines BL and BL'. However, for a null-read operation it is more critical to have bit lines BL and BL' pre-charged and fully equalized to minimize the effects of any SA offset voltage due to insufficient time Tpc. Also, if bit lines BL and BL' have an unbalanced number of memory cells 100 storing “1s” and memory cells 100 storing “0s”, then the offset voltage due to leakage may favor either bit lines BL or BL' depending on the number of memory cells 100 storing “1s” and memory cells 100 storing “0s” connected to bit lines BL or BL'. In order to minimize the offset voltage on bit lines BL and BL' before a null read, Applicant has realized that a number of different steps may be performed. Such steps may be performed by DVC 54.

(i) To ensure proper pre-charging of bit lines BL and BL', DVC 54 may add an extra SRAM No-OP cycles to ensure bit lines BL and BL' may be fully equalized and precharged high. No-Op cycles are when there is no read from or write to cell 100 after pre-charging.

(ii) To avoid such impacts of leakage, DVC 54 may ensure equal numbers of stored 0s and 1s per bit line pair. For example, columns may be written with alternating stored 0s and stored 1s.

(iii) To ensure balanced bit lines BL and BL', DVC 54 may make a valid-read prior to a null-read. A valid read is one where word line WL activates a cell 100.

(iv) To ensure balanced bit lines BL and BL', DVC 54 may make a valid-write of 0, followed by a valid-read, prior to a null-read. Similarly, a valid write is one where word line WL activates a cell 100.

A null-read after valid-read or valid-write operation may have further unpredicted results pending on previous operation and data background.

ALTERNATE EMBODIMENTS

The design of SA 400 as shown in FIG. 4 is an example only, variations of sense amplifier designs known in the art, may also be used.

Although standard 6T SRAM is described in FIGS. 1 and 2, alternate embodiments may utilize 8T, dual-port and multi-port SRAM.

Figure 8:
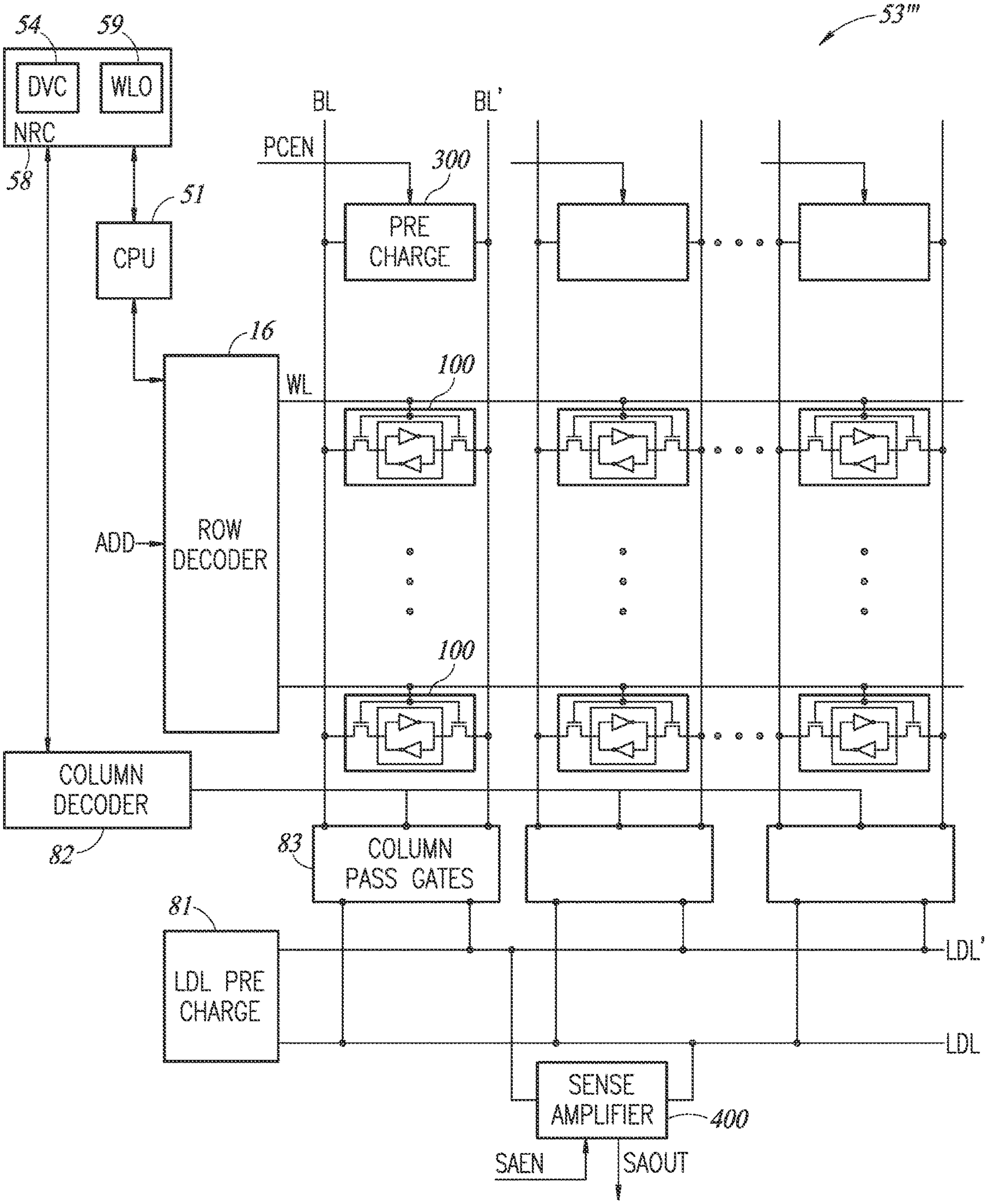
FIG. 8 is a schematic illustration of a SRAM memory array with column decoder and column pass gate.

Reference is made to FIG. 8 which illustrates an alternate embodiment of RAM array 53''' which also comprises a differential local data line pair LDL and LDL', an LDL pre-charge circuit 81, a column decoder 82, column pass gates 83 and NRC 58. Column pass gates 83 may be used to multiplex multiple column differential bit line pairs BL and BL' to differential local data line pair LDL and LDL' such that differential local data line pair LDL and LDL' may be connected to SA 400, rather than differential bit line pair BL and BL' being connected directly to SA 400, as described herein above. Column pass gate 83 may be decoded by column decoder 82 using a column line CL. After LDL pre-charge circuit 81 pre-charges and equalizes local data line pair LDL and LDL', then NRC 58 may perform a null-read operation by disabling column decoder 82 (similar to the manner in which row decoder 16 may be disabled, as described hereinabove) such that LDL and LDL' do not connect to BL and BL' and there is no signal developed by memory cell 100.

Alternate embodiments of a STRNG may be implemented on DRAM (dynamic random access memory), since DRAM also has a similar differential sensing mechanism in its sense amplifiers.

Spatial Randomness

As mentioned hereinabove, an SA 400 with large offset voltages may produce the same and consistent logical output during a null-read operation and an SA 400 with very small offset voltage may produce random logic outputs from null-read cycle to null-read cycle.

Applicant has realized that the offset voltage distribution of sense amplifiers may vary from location to location on an SRAM chip, and may also vary from SRAM chip to SRAM chip. Therefore, the result of a null read made across multiple SRAM locations may be unpredictable and may be “spatially random”.

Likewise, bit lines BL and BL' may have weak cells that leak more than an average cell. These weak cells may be spatially randomly distributed across SRAM locations and may also be used as the basis for random number generation.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A true random number generator system, the system comprising:
a random access memory (RAM) array having memory cells for storing data therein, said memory cells being connected in rows to word lines and in columns to pairs of bit lines, and a sense amplifier to sense a differential input signal, wherein said differential input signal is on one of: said pairs of bit lines when connected to said sense amplifier, and a pair of local data lines when connected to said sense amplifier;
a null-read controller to implement at least one null-read operation by said sense amplifier of at least a portion of said RAM array; and
a hash generator to receive at least one null-read result from said at least one null-read operation and to output at least a partial true random number based on said at least one null read result,
wherein said null-read controller comprises:
a differential voltage conditioner (DVC) to minimize sense amplifier offset voltage in said sense amplifier during said at least one null-read operation; and
a word line overrider (WLO) to stop a row controller activating connected word lines during a null-read of said differential input signal on one of said pairs of bit lines, said connected word lines being connected to said rows of said memory cells.

2. The system of claim 1 and said WLO to output a word line address disable (WLAD) signal to disable all word line activations by a row decoder.

3. The system of claim 1 and said WLO to output an unconnected word line selection (UWLS) signal, to enable said row controller to activate only unconnected word lines, said unconnected word lines being not connected to said rows of said memory cells.

4. The system of claim 1 wherein, prior to said at least one null-read operation, said DVC to condition one of said pairs of bit lines by at least one of equalizing a number of stored 0s and 1s per said one of said pairs of bit lines, performing at least one additional RAM no operation (No-OP) cycle, performing a valid-read operation, and, performing a valid-write of 0 followed by a valid-read operation.

5. The system of claim 1 wherein said RAM array is an SRAM (static random access memory) array.

6. The system of claim 1 wherein said RAM array is a DRAM (dynamic random access memory) array.

7. The system of claim 1 wherein said at least one null-read operation is at least one of a single null read, a multiplicity of sequential null reads and a multiplicity of simultaneous null reads.

8. The system of claim 1 and said RAM array to store said at least one null-read result.

9. The system of claim 8 and said null-read controller to concatenate at least two of said at least one null-read result to form a concatenated null-read result.

10. The system of claim 1 and said RAM array to store said at least a partial true random number.

11. The system of claim 10 and said hash generator to concatenate at least two of said partial true random numbers to form a true random number.

12. The system of claim 5 wherein said memory cells are at least one of 6T SRAM, 8T SRAM, dual-port SRAM and multi-port SRAM.

13. The system of claim 1 wherein said RAM array is one of a multiplicity of RAM arrays arranged into at least one RAM bank.

14. A true random number generator system, the system comprising:
a random access memory (RAM) array having memory cells for storing data therein, said memory cells being connected in rows to word lines and in columns to pairs of bit lines, and a sense amplifier to sense a differential input signal, wherein said differential input signal is on one of: said pairs of bit lines when connected to said sense amplifier, and a pair of local data lines when connected to said sense amplifier;
a null-read controller to implement at least one null-read operation by said sense amplifier of at least a portion of said RAM array; and
a hash generator to receive at least one null-read result from said at least one null-read operation and to output at least a partial true random number based on said at least one null read result,
wherein said null-read controller comprises:
a differential voltage conditioner (DVC) to minimize sense amplifier offset voltage in said at least one sense amplifier during said at least one null-read operation; and
a column controller to stop column pass gates connecting said one of said pairs of bit lines to said pair of local data lines during a null read of said differential input signal on said pairs of local data lines.

15. The system of claim 14 wherein, prior to said at least one null-read operation, said DVC to condition said pair of local data lines by at least one of equalizing a number of stored 0s and 1s connected to said pair of local data lines, performing at least one additional RAM No-OP cycle, performing a valid-read operation, and, performing a valid-write of 0 followed by a valid-read operation.

16. A method for a RAM (random access memory) array, the method comprising:
executing a null-read operation, wherein said executing a null-read operation comprises:
pre-charging a pair of differential lines in said RAM array to a predetermined voltage; and
differentially reading a differential signal on said pair of differential lines by a sense amplifier without receiving a second differential signal from a memory cell onto said pair of differential lines after said pre-charging,
wherein said pair of differential lines is one of: a pair of bit lines when attached to said sense amplifier, and a pair of local data lines when attached to said sense amplifier, and
wherein said differentially reading comprises one of: enabling a word line address disable (WLAD) signal to disable all word line activations by a row decoder, and enabling an unconnected word line selection (UWLS) signal such that a row controller activates only unconnected word lines which are said word lines that are not connected to rows of said memory cells.

17. The method of claim 16 and comprising conditioning said pair of differential lines prior to said pre-charging by at least one of equalizing a number of stored 0s and 1s per said pair of differential lines, performing at least one additional RAM no operation (No-OP) cycle, performing a valid-read operation, and performing a valid-write of 0 followed by a valid-read operation.

18. The method of claim 16 wherein said RAM array is an SRAM (static random access memory) array.

19. The method of claim 16 wherein said RAM array is a DRAM (dynamic random access memory) array.

20. A method for a RAM (random access memory) array, the method comprising:

executing a null-read operation, wherein said executing a null-read operation comprises:

pre-charging a pair of differential lines in said RAM array to a predetermined voltage; and differentially reading a differential signal on said pair of differential lines by a sense amplifier without receiving a second differential signal from a memory cell onto said pair of differential lines after said pre-charging, wherein said pair of differential lines is one of: a pair of bit lines when attached to said sense amplifier, and a pair of local data lines when attached to said sense amplifier, and wherein said differentially reading comprises stopping column pass gates connecting pairs of bit lines to a pair of local data lines, said pairs of bit lines also being connected to said columns of said memory cells.

21. A method to generate a true random number, the method comprising:

pre-charging at least one pair of differential lines in at least a portion of a RAM array to a predetermined voltage;

null-reading a differential signal on said at least one pair of differential lines;

receiving at least one null-read result from said null-reading; and generating at least a partial true random number based on said at least one null-read result, wherein said at least one pair of differential lines is one of: a pair of bit lines when attached to a sense amplifier, and a pair of local data lines when attached to said sense amplifier, wherein said null-reading comprises differentially reading the differential signal on said at least one pair of differential lines by said sense amplifier, without receiving a second differential signal from a memory cell onto said at least one pair of differential lines after said pre-charging, and wherein said differentially reading comprises one of: enabling a word line address disable (WLAD) signal to disable all word line activations by a row decoder, and enabling an unconnected word line selection (UWLS) signal such that a row controller activates only unconnected word lines which are said word lines that are not connected to rows of said memory cells.

22. A method to generate a true random number, the method comprising:

pre-charging at least one pair of differential lines in at least a portion of a RAM array to a predetermined voltage;

null-reading a differential signal on said at least one pair of differential lines;

receiving at least one null-read result from said null-reading; and generating at least a partial true random number based on said at least one null-read result, wherein said at least one pair of differential lines is one of: a pair of bit lines when attached to a sense amplifier, and a pair of local data lines when attached to said sense amplifier, wherein said null-reading comprises differentially reading the differential signal on said at least one pair of differential lines by said sense amplifier, without receiving a second differential signal from a memory cell onto said at least one pair of differential lines after said pre-charging, and wherein said differentially reading comprises stopping column pass gates connecting pairs of bit lines to a pair of local data lines, said pairs of bit lines also being connected to said columns of said memory cells.

23. The method of claim 22 wherein said null-reading is at least one of a single null read, a multiplicity of sequential null reads and a multiplicity of simultaneous null reads.

24. The method of claim 22 and comprising first storing said at least one null-read result in at least one RAM array.

25. The method of claim 22 and comprising first concatenating at least two of said at least one null-read result to form a concatenated null-read result.

26. The method of claim 22 and comprising storing said at least a partial true random number in said RAM array.

27. The method of claim 22 and comprising concatenating at least two said partial true random numbers to form a true random number.

28. The method of claim 22 and comprising conditioning said at least one pair of differential lines prior to said pre-charging by at least one of equalizing a number of stored 0s and 1s per differential line pair, performing at least one additional RAM no operation (No-OP) cycle, performing a valid-read operation, and performing a valid-write of 0 followed by a valid-read operation.

29. The method of claim 22 wherein said RAM array is an SRAM (static random access memory) array.

30. The method of claim 29 wherein said RAM array is one of a 6T SRAM, 8T SRAM, dual-port SRAM and multi-port SRAM array.

31. The method of claim 22 wherein said RAM array is a DRAM (dynamic random access memory) array.

* * * * *